United States Patent
Chae et al.

(10) Patent No.: US 8,062,924 B2
(45) Date of Patent: Nov. 22, 2011

(54) THIN FILM TRANSISTOR, METHOD FOR FABRICATING THE SAME AND DISPLAY DEVICE

(75) Inventors: Gee Sung Chae, Incheon-si (KR); Jae Seok Heo, Gunpo-si (KR); Woong Gi Jun, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/656,507

(22) Filed: Feb. 1, 2010

(65) Prior Publication Data

US 2010/0136756 A1 Jun. 3, 2010

Related U.S. Application Data

(62) Division of application No. 11/644,981, filed on Dec. 26, 2006, now Pat. No. 7,683,367.

(30) Foreign Application Priority Data

Jun. 30, 2006 (KR) .................. 10-2006-0061431

(51) Int. Cl.
*H01L 51/40* (2006.01)
(52) U.S. Cl. ............ 438/99; 257/40; 257/E51.001
(58) Field of Classification Search .......... 257/40, 257/E51.001; 438/99
See application file for complete search history.

(56) References Cited

U.S. PATENT DOCUMENTS

| | | | |
|---|---|---|---|
| 7,253,017 B1 | 8/2007 | Roscheisen et al. | |
| 2003/0059984 A1* | 3/2003 | Sirringhaus et al. | 438/141 |
| 2006/0138404 A1 | 6/2006 | Okada et al. | |
| 2006/0232735 A1 | 10/2006 | Hokazono et al. | |
| 2007/0104878 A1 | 5/2007 | Kodas et al. | |
| 2007/0117271 A1 | 5/2007 | Kodas et al. | |
| 2007/0178232 A1 | 8/2007 | Kodas et al. | |

FOREIGN PATENT DOCUMENTS

| | | |
|---|---|---|
| JP | 2003-177682 | 6/2003 |
| JP | 2003-218361 | 7/2003 |
| JP | 2006-135327 | 5/2006 |
| TW | 588473 | 5/2004 |
| TW | 236173 | 7/2005 |
| TW | 249857 | 2/2006 |

* cited by examiner

*Primary Examiner* — Kenneth Parker
*Assistant Examiner* — Anthony Ho
(74) *Attorney, Agent, or Firm* — McKenna Long & Aldridge, LLP

(57) ABSTRACT

A method for fabricating a TFT on a substrate includes forming a gate electrode; forming a semiconductor layer insulated from the gate electrode and partially overlapped with the gate electrode; forming a gate insulating layer between the gate electrode and the semiconductor layer, the gate insulating layer including a sol-gel compound; and forming source and drain electrodes at both sides of the semiconductor layer.

9 Claims, 7 Drawing Sheets

THIN FILM TRANSISTOR, METHOD FOR FABRICATING THE SAME AND DISPLAY DEVICE

This is a divisional application of U.S. patent application Ser. No. 11/644,981, filed Dec. 26, 2006, now U.S. Pat. No. 7,683,367 which claims the benefit of Korean Patent Application No. 10-2006-0061431, filed on Jun. 30, 2006, all of which are hereby incorporated by reference as if fully set forth herein.

BACKGROUND OF THE INVENTION

1. Field of the Invention

The present invention relates to a display device including a liquid crystal display (LCD) device, and more particularly, to a TFT array substrate and method for fabricating the same.

2. Discussion of the Related Art

Recently, liquid crystal display (LCD) devices have received much attention as flat panel display devices. The LCD devices have been actively studied owing to their high contrast ratio, suitability for displaying gray levels or moving pictures, and low power consumption.

Particularly, since LCD devices can be fabricated with a thin thickness, they can be used as a ultra slim display device such as wall-mountable TVs. Also, since LCD devices are lightweight and have a lower power consumption than CRTs, they are used as displays for notebook computers operating with batteries, personal portable terminals, TVs, and monitors for spacecrafts. In this way, LCD devices have received much attention as a display device for the next generation.

Generally, an LCD device includes a TFT array substrate provided with a TFT, a pixel electrode, and a storage capacitor in each pixel region defined by gate and data lines, a color filter array substrate provided with a color filter layer and a common electrode, and a liquid crystal layer interposed between the two substrates. The LCD device displays a picture image by applying a voltage to the electrodes to rearrange the liquid crystal molecules of the liquid crystal layer and controlling the light transmittance.

In such an LCD device, the TFT is used as a switching device for displaying images.

The TFT is formed at a crossing portion between the gate and data lines in a unit pixel region, and serves to switch a current with respect to the unit pixel region. During the on-state of the TFT, the current flows to charge a capacitor connected to a specific unit pixel region at a desired voltage. During the off-state, the charged state is maintained until the next period that the unit pixel region is addressed.

A voltage level determines a gray level that represents an amount of light transmitted through a liquid crystal layer corresponding to the unit pixel region.

The aforementioned TFT has two types of structures, i.e., a coplanar type TFT of which source and gate electrodes are arranged on one plane, and a staggered type TFT of which source and gate electrodes are arranged on different planes. In general, a polycrystalline silicon TFT employs the coplanar type TFT while an amorphous silicon TFT employs the staggered type TFT.

The staggered type TFT is divided into an inverted staggered type TFT and a normal staggered type TFT, wherein the inverted staggered type TFT includes a gate electrode arranged below source and drain electrodes, and the normal staggered type TFT includes a gate electrode arranged above source and drain electrodes. The inverted staggered type TFT is referred to as a bottom-gate type TFT, and the normal staggered type TFT is referred to as a top-gate type TFT.

Generally, the LCD device is provided with a bottom-gate type TFT. As shown by FIG. 1, the bottom-gate type TFT includes a gate electrode 12a, a gate insulating layer 13 provided on an entire surface including the gate electrode, a semiconductor (a-Si) layer 14 formed on the gate insulating layer on the gate electrode, an ohmic contact layer (n+a-Si) 14a provided in other regions except a channel region of the semiconductor layer, and source and drain electrodes 15a and 15b formed on the ohmic contact layer.

The gate insulating layer 13 is formed in such a manner that an inorganic material such as silicon nitride (SiNx) or silicon oxide (SiOx) having a dielectric constant of about 7.5 is deposited by a plasma enhanced chemical vapor deposition (PECVD) process.

However, when the gate insulating layer is formed by depositing such an inorganic material, the following problems may occur.

In other words, when the gate insulating layer is formed of such an inorganic material, it is difficult for the gate insulating layer to have a uniform thickness with a single deposition process. Accordingly, the deposition process should be performed twice. This complicates the fabrication process and increases the production costs.

To solve the above problem, a method for forming a gate insulating layer of an organic material having a dielectric constant of 3 to 4 has been suggested. By this method, the gate insulating layer can be formed by a simple process with inexpensive equipment.

Unlike the inorganic gate insulating layer, because the organic gate insulating layer is formed by a coating process, such as a spin coating or slit coating, not the PECVD process, the process steps are simplified and the production cost is reduced. Also, the steps of the gate line and the gate electrode is planarized by a uniform thickness of such an organic gate insulating layer.

However, because the organic gate insulating layer has a smaller dielectric constant than that of the inorganic gate insulating layer, when the organic and inorganic gate insulating layers have the same thickness, a parasitic capacitance (Cgs) value formed between a gate line layer and a data line layer becomes small. This is because an insulating layer formed between opposing electrodes has a capacitance value proportional to its dielectric constant and thickness, but inversely proportional to areas of the opposing electrodes.

If the parasitic capacitance (Cgs) value becomes small, voltage drop ΔVp increases as expressed by the following equation 1. Such a small parasitic capacitance (Cgs) value causes undesired effects such as a flicker, image sticking or uneven screen brightness.

$$\Delta Vp = \frac{Cgs}{Cgs + Cst + Clc} \Delta Vg \qquad \text{[Equation 1]}$$

In this case, Cgs is parasitic capacitance formed between the gate electrode and the source and drain electrodes, Clc is capacitance accumulated in a liquid crystal cell, and Cst is capacitance formed in a storage capacitor. ΔVp is a differential voltage between a data voltage Vd applied to the source electrode and a voltage Vlc charged in the liquid crystal cell, and ΔVg is a differential voltage between a gate voltage Vgh of a high level and a gate voltage Vgl of a low level.

In other words, the parasitic capacitance Cgs greatly affects ΔVp as expressed by the equation 1, and is closely related to panel characteristics and picture quality characteristics. To lower ΔVp, the parasitic capacitance Cgs value should be increased. To increase the parasitic capacitance Cgs value, the dielectric constant of the gate insulating layer should be increased. Accordingly, the gate insulating layer should have a high dielectric constant.

As described above, the aforementioned related art method for fabricating the TFT array substrate has the following problems.

When an inorganic insulating layer of silicon nitride or silicon oxide is used for the gate insulating layer, the fabrication process becomes complicated and the production costs increase. Also, when an organic insulating layer such as PVA (polyvinyl alcohol) and PVP (polyvinyl phenol) is used for the gate insulating layer, ΔVp value increases due to the low dielectric constant of the organic insulating layer and the coating thickness of the gate insulating layer becomes uneven.

To solve the problems of the related art organic/inorganic insulating layer, a sol-gel type composite material has been recently suggested for the gate insulating layer.

Such a sol-gel type composite material is formed by chemically reacting silicon alkoxide with metal alkoxide. Then, the sol-gel composite material is mixed with a solvent, uniformly coated on a substrate, soft-baked at a temperature of 70° C., and hard-baked at a temperature of 300° to form the gate insulating layer.

However, a crack may occur on the surface of the gate insulating layer during the soft-baking and hard-baking processes.

SUMMARY OF THE INVENTION

Accordingly, the present invention is directed to a thin film transistor array substrate and method for fabricating the same, which substantially obviates one or more problems due to limitations and disadvantages of the related art.

An advantage of the present invention is to provide a thin film transistor array substrate and method for fabricating the same that can minimize a crack of a sol-gel type gate insulating layer.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, a method for fabricating a TFT on a substrate includes forming a gate electrode; forming a semiconductor layer insulated from the gate electrode and partially overlapped with the gate electrode; forming a gate insulating layer between the gate electrode and the semiconductor layer, the gate insulating layer including a sol-gel compound; and forming source and drain electrodes at both sides of the semiconductor layer.

In another aspect of the present invention, a display device includes a display panel; a gate driver applying scanning signals to a plurality of gate lines and a data driver applying video signals to a plurality of data lines in the display panel, the gate and data lines defining a plurality of pixels; and a thin film transistor in each pixel, the thin film transistor including a gate electrode, a gate insulating layer, a semiconductor layer, and source/drain electrodes, wherein the gate insulating layer is formed of an organic/inorganic hybrid type material including silicon and a metal.

In yet another aspect of the present invention, a thin film transistor (TFT) on a substrate includes a gate electrode; a semiconductor layer insulated from the gate electrode and partially overlapped with the gate electrode; a gate insulating layer between the gate electrode and the semiconductor layer, the gate insulating layer including a sol-gel compound; and source and drain electrodes at both sides of the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
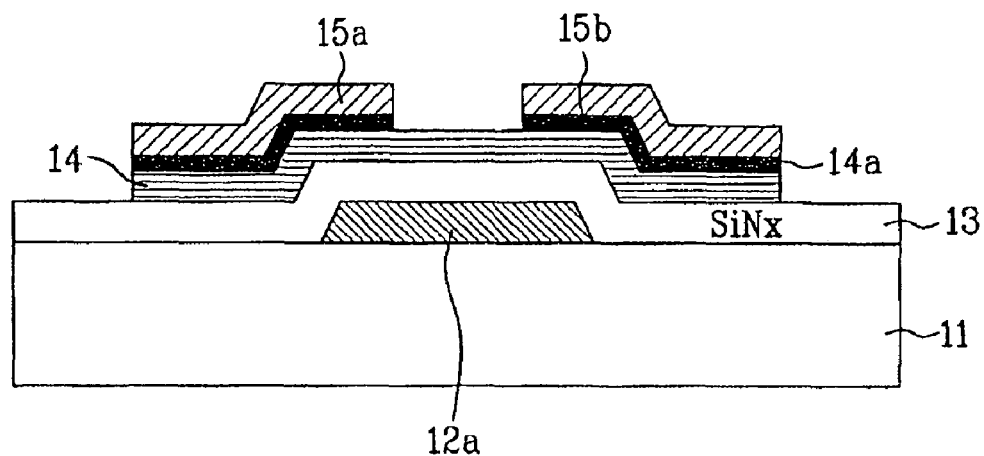
FIG. 1 is a sectional view illustrating a bottom-gate type TFT according to the related art.
Figure 2:
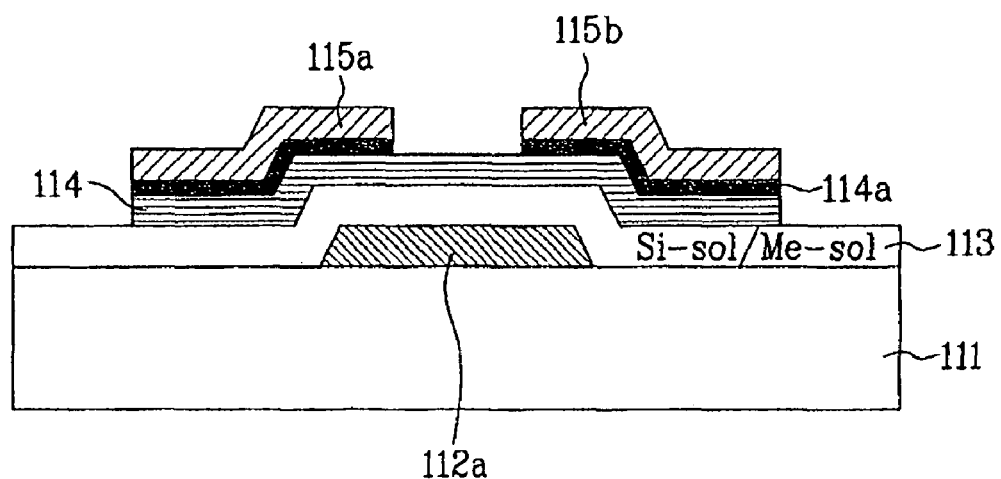
FIG. 2 is a sectional view illustrating a bottom-gate type TFT according to the present invention.
Figure 3:
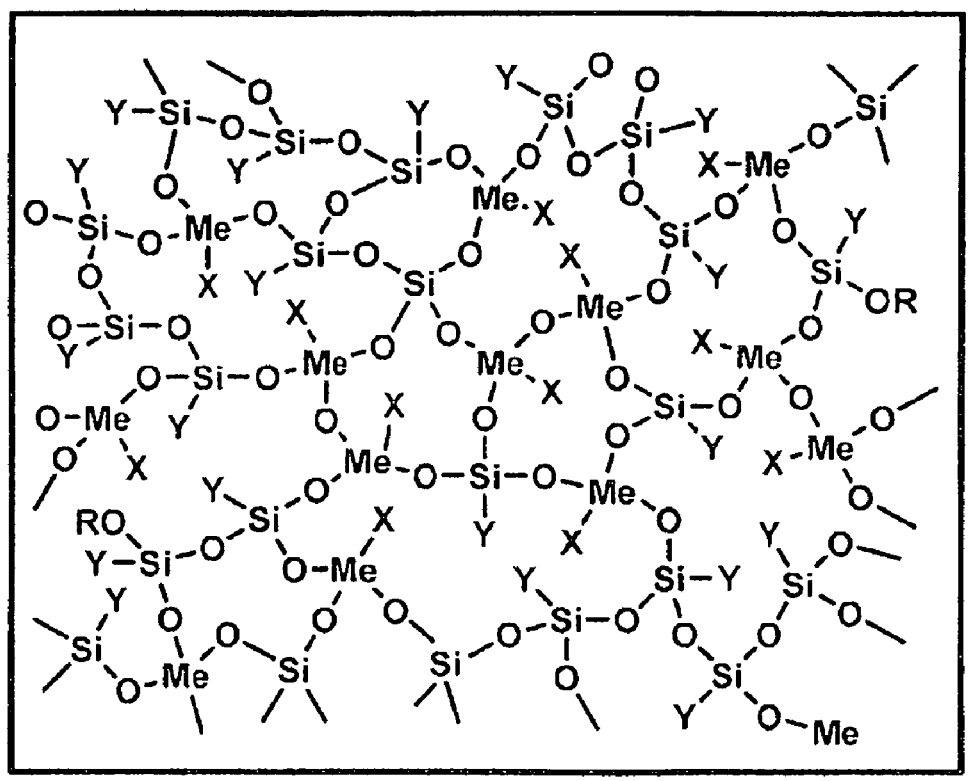
FIG. 3 illustrates a chemical network structure of a sol-gel compound according to the present invention.
Figure 7:
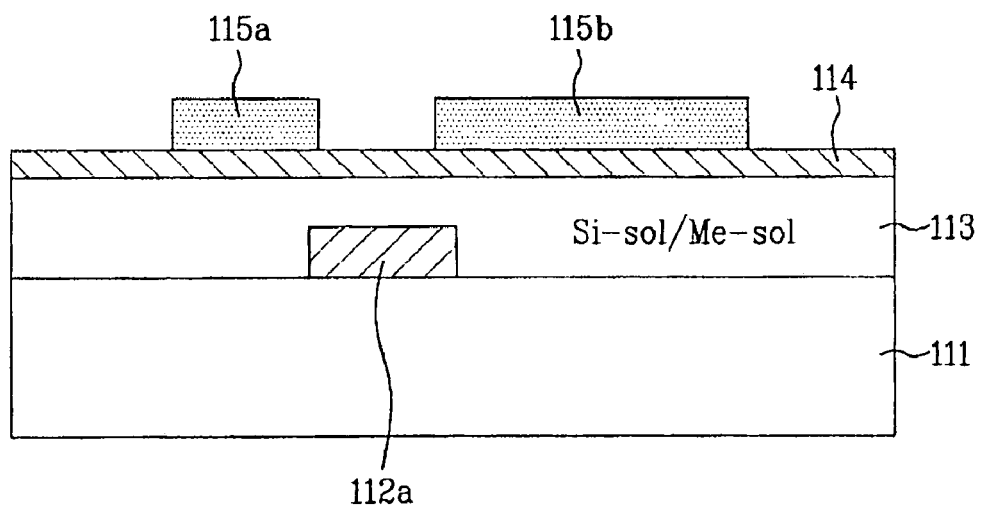
FIG. 7 is a sectional view illustrating a bottom-gate type organic TFT according to the present invention.
Figure 8:
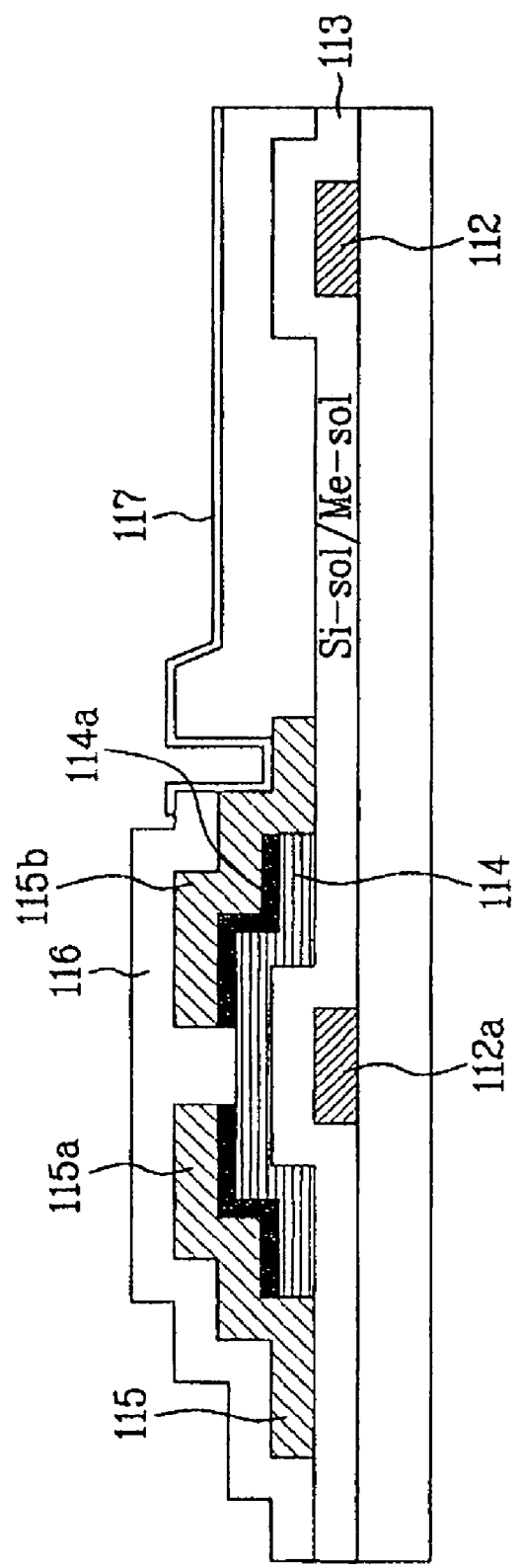
FIG. 8 is a sectional view illustrating a TFT array substrate according to the present invention.

FIG. 2 is a sectional view illustrating a bottom-gate type TFT according to the present invention, FIG. 3 illustrates a chemical bonding of a sol-gel compound according to the present invention, FIG. 7 is a sectional view illustrating a bottom-gate type organic TFT according to the present invention, and FIG. 8 is a sectional view illustrating a TFT array substrate according to the present invention.

Method for Fabricating TFT

Referring to FIG. 2, a metal having a low resistance, such as Cu, Al, AlNd (Aluminum Neodymium), Mo, Cr, Ti, Ta, MoW, or the like is deposited on a substrate 111 by a sputtering process. The metal is then patterned by a photolithography process to form a gate electrode 112a.

Afterwards, a gate insulating layer 113 is formed on an entire surface including the gate electrode 112a. The gate insulating layer 113 is formed of an organic/inorganic hybrid type material including silicon and a metal, wherein the organic/inorganic hybrid type material may be a composite material including a sol-gel compound (Si-sol/Me-sol) of silicon alkoxide and metal alkoxide.

The characteristics of the related art transistor, which uses silicon nitride as the gate insulating layer, and the transistor of the present invention, which uses a composite material (sol-gel compound) as the gate insulating layer, will now be compared with each other.

Figure 4:
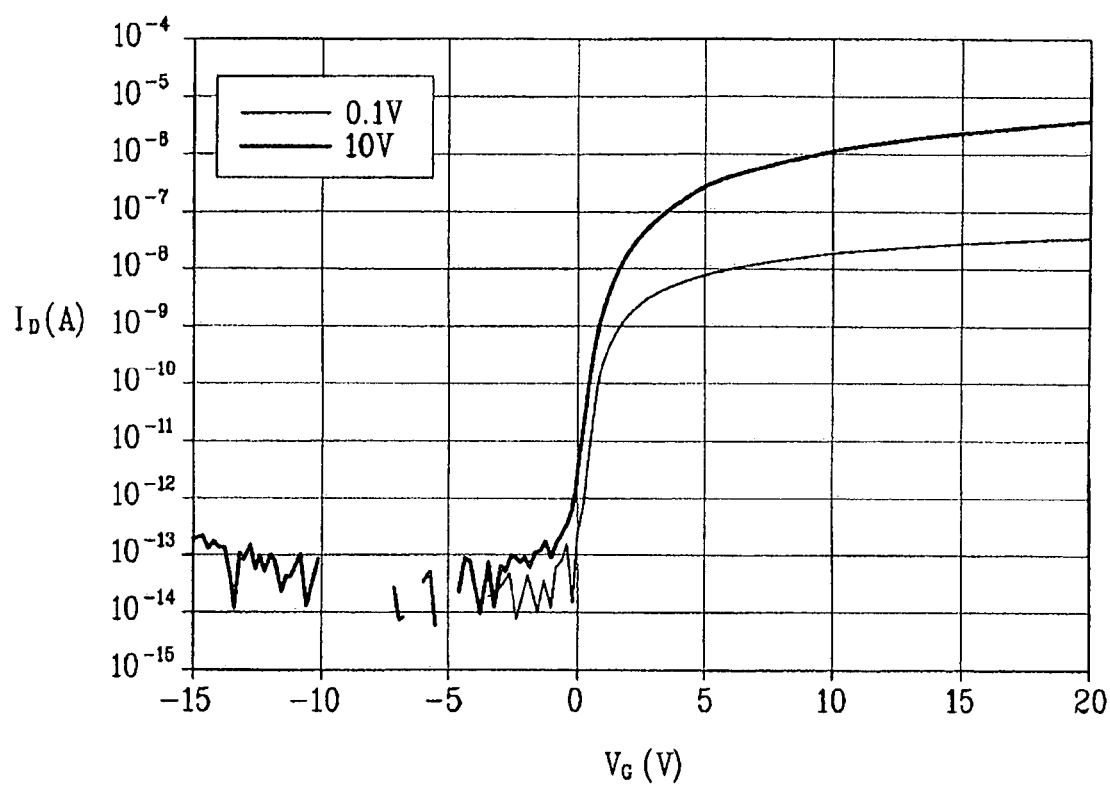
FIG. 4 is a graph illustrating the property of a TFT including a gate insulating layer formed of SiNx.

FIG. 4 is a graph illustrating the characteristics of the related art transistor where silicon nitride is deposited at a thickness less than 4000 Å to form the gate insulating layer and a channel layer of the transistor has a width/length of 25/5. In FIG. 4, the horizontal axis $V_G$ represents a value of a voltage applied to the gate electrode, and the vertical axis $I_D$ represents a value of a current flowing between source and drain electrodes. Each graph illustrates the relation between the voltage applied to the gate electrode and the current flowing between the source and drain electrodes when 0.1V and 10V are respectively applied between the source and drain electrodes. The mobility of the transistor is about 0.411 cm$^2$/Vs.

Figure 5:
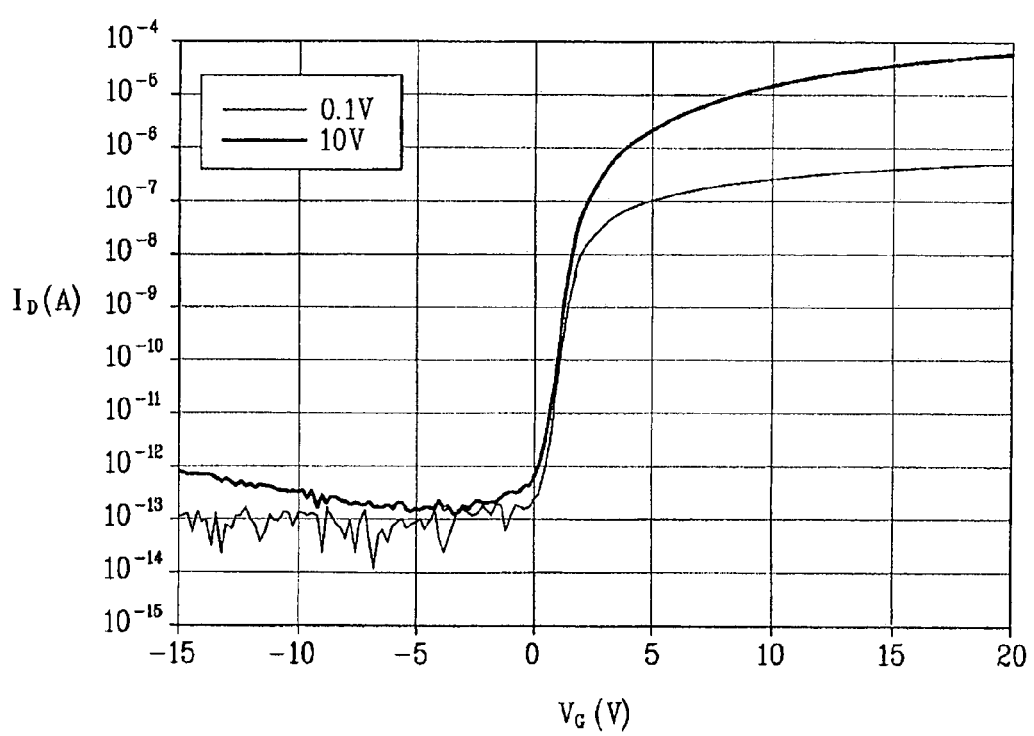
FIG. 5 is a graph illustrating the property of a TFT including a gate insulating layer formed of a sol-gel compound.

FIG. 5 is a graph illustrating the characteristics of a transistor according to the present invention where a composite material is deposited at a thickness less than 3000 Å to form the gate insulating layer and a channel layer of the transistor has a width/length of 100/10. As shown in FIG. 5, the transistor according to the present invention, which uses the composite material as the gate insulating layer, has a better switching characteristic as compared with the related art transistor. In this case, the mobility of the transistor is 1.705 cm$^2$/Vs, which is four times greater than that of the related art transistor where silicon nitride is used as the gate insulating layer.

Figure 6:
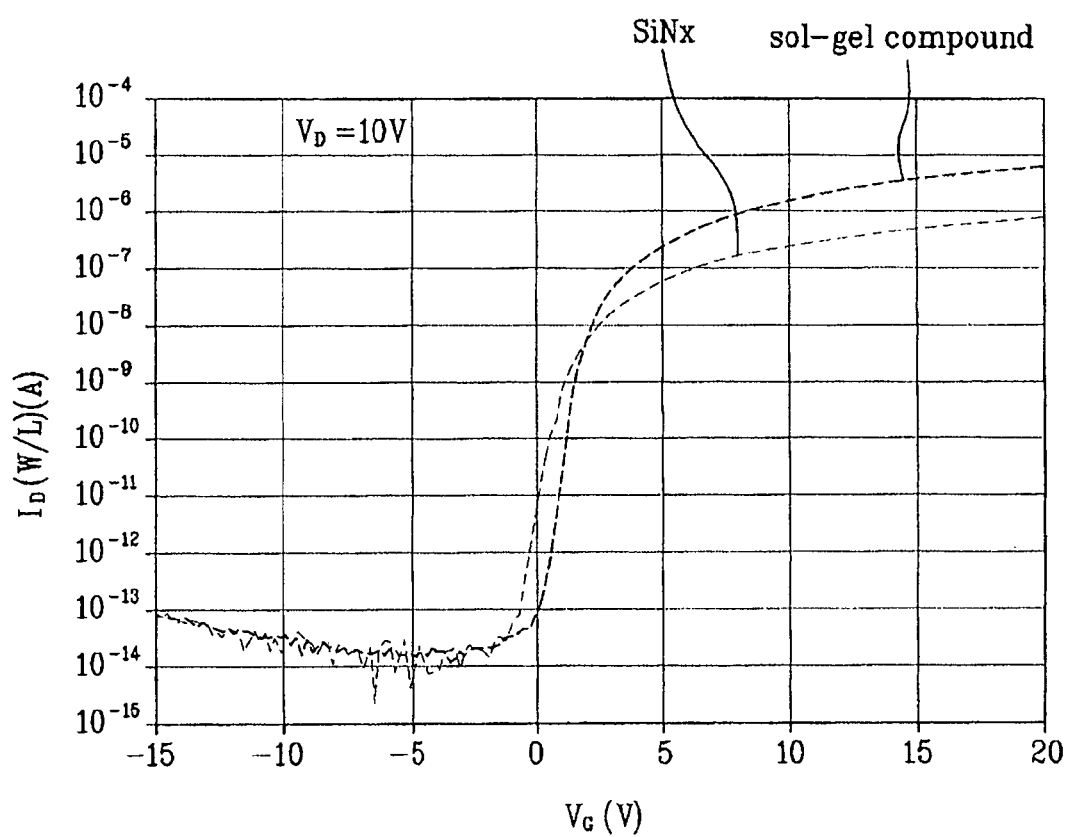
FIG. 6 is a graph comparing the properties of TFTs with each other, the respective TFT including any one of SiNx and a sol-gel compound as a gate insulating layer.

The characteristics of the related art transistor and the transistor of the present invention are compared with each other in FIG. 6. In FIG. 6, the horizontal axis $V_G$ represents a value of a voltage applied to the gate electrode, and the vertical axis $I_D$ represents a value of a current flowing between source and drain electrodes. It is noted that in order to properly compare the characteristics of the two transistors having different values of W/L, the values of $I_D$ are normalized with W/L. As shown in FIG. 6, the transistor that includes the gate insulating layer of the sol-gel compound has better characteristics than the related art transistor.

When the gate insulating layer is formed of the sol-gel compound, a crack may occur as the solvent volatilizes during a baking process. In order to prevent the crack from occurring, a composite material (Si-sol/Me-sol) that includes a sol-gel compound of Me alkoxide having a functional group X and Si alkoxide having a functional group Y can be used. Alkoxide is a compound obtained by substituting metal atoms for hydrogen atoms of a hydroxyl group of alcohol, and each of the functional groups X and Y is selected from least one of groups consisting of a functional group having a double bond

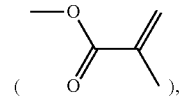

a triple bond

an acrylate group

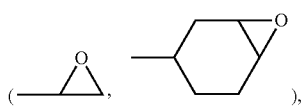

an epoxy group (△—O, ⬡—O), an oxetane group (□—O)

and an alkyl group.

Specifically, Si alkoxide reacts with Me alkoxide of a sol type to form a sol-gel composite material. This composite material is an organic/inorganic hybrid type material, and its dielectric constant and transmittance depend on a content ratio of Si alkoxide and Me alkoxide. A mixture ratio of 1:1 between Si alkoxide and Me alkoxide is beneficial for the gate insulating layer to have a high dielectric constant and transmittance.

In order for the gate insulating layer to have a high dielectric constant of 7 or greater, at least one of Ti, Zr, Y, Al, Hf, Ca and Mg is selected as a metal particle of the Me alkoxide.

The sol-gel compound of the Si alkoxide and the Me alkoxide is fabricated by a hydrolysis and condensation reaction. At this time, water or alcohol may be used as a catalyst for accelerating the reaction.

The sol-gel compound has a chemical network structure illustrated in FIG. 3. The sol-gel compound includes the functional groups X and Y, and its end or side chain is bonded to an alkyl group (CHC$_3$—, C$_2$H$_5$—, C$_3$H$_7$—, . . . , C$_n$H$_{2n+1}$—) or phenyl group. Each of the functional groups X and Y is selected from at least one of groups consisting of a functional group having a double bond or triple bond, an acrylate group, an epoxy group that enables a positive ion polymerization, and an oxetane group, as shown below. Although not shown below, an alkyl group may be selected as the functional groups X or Y.

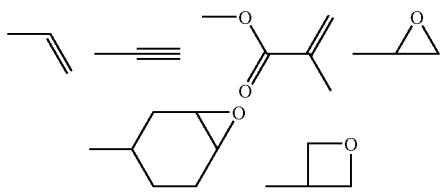

The sol-gel compound of the present invention has a high free molecular volume due to the functional groups X and Y. After the sol-gel composite material is mixed with a solvent and then uniformly coated on the substrate, it is soft-baked at a temperature of 70° C. and hard-baked at a temperature of 300° C. The composite material is less contracted during the baking processes because of the free volume obtained by the functional groups X and Y, thereby minimizing cracks on the surface of the gate insulating layer.

Furthermore, the functional groups X and Y induce a cross-linking in the molecules so that the heat-resistance of the composite material is improved.

The organic and inorganic composite material has excellent characteristics in the areas of insulation, coating, heat-resistance, hardness and transmittance, and its dielectric constant can easily be controlled. As a result, it is suitable for the gate insulating layer of TFTs.

The organic and inorganic composite material of the present invention can be formed by any one of printing, coating and deposition methods, and it also has an excellent planarization characteristic. Thus, the fabrication process of TFTs can be simplified.

After forming the gate insulating layer of the organic and inorganic composite material, amorphous silicon (a-Si) is deposited on an entire surface including the gate insulating layer with a thickness of 500 Å at a high temperature to form a semiconductor layer 114. Then, a-Si doped with n-type impurity ions is deposited with a thickness of 300 Å to 700 Å at a high temperature to form an ohmic contact layer 114a (n+a-Si). Beneficially, the a-Si and n+a-Si depositions are successively performed in the same process chamber.

A metal having a low resistance, such as Cu, Al, AlNd, Mo, Cr, Ti, Ta, MoW, or the like is then deposited on an entire surface including the ohmic contact layer 114a by a sputtering process. The metal layer is then patterned by a photolithography process to form source and drain electrodes 115a and 115b at both sides of the semiconductor layer 114.

Thus, the thin film transistor that includes the gate electrode 112a, the gate insulating layer 113, the semiconductor layer 114, the ohmic contact layer 114a and the source and drain electrodes 115a and 115b is completed.

The thin film transistor described above is a bottom-gate type thin film transistor wherein the gate electrode is positioned under the source and drain electrodes. However, it should be understood that the principles of the present invention is applicable to other types of thin film transistors including a top-gate type thin film transistor.

In case of the top-gate type thin film transistor, source and drain electrodes are formed on a substrate. Then, a semiconductor layer is formed to overlap the source and drain electrodes and at the same time to be arranged between the source and drain electrodes. A gate insulating layer is then formed on an entire surface including the semiconductor layer. A gate electrode is finally formed on the gate insulating layer.

The source and drain electrodes and the gate electrode are formed by depositing a metal having a low resistance, such as Cu, Al, AlNd, Mo, Cr, Ti, Ta, MoW, or the like using a sputtering process and by pattering the metal using a photolithography process. The semiconductor layer is formed by depositing a-Si at a high temperature and patterning the same using a photolithography process.

The gate insulating layer is formed by depositing, printing or coating the composite material including the sol-gel compound of Me alkoxide having the functional group X and Si alkoxide having the function group Y, and by hardening the composite material.

Method for Fabricating Organic TFT

A method for fabricating an organic TFT is the same as or similar to the aforementioned method for fabricating a TFT. Accordingly, the same reference numerals will be used to refer to the same or similar patterns.

Referring to FIG. 7, n+a-Si, indium tin oxide (ITO), and Al are deposited on a substrate 111 and then patterned by a photolithography process to form a gate electrode 112a. In addition to the aforementioned layers, the gate electrode 112a may include a conductive organic polymer material such as PEDOT (polyethylene-dioxythiophene) formed by a coating or inject-printing method.

A gate insulating layer 113 of a composite material (Si-sol/Me-sol) including a sol-gel compound of Me alkoxide having a functional group X and Si alkoxide having a functional group Y is then formed on an entire surface including the gate electrode 112a. Each of the functional groups X and Y is selected from at least one of groups consisting of a functional group having a double bond or triple bond, an acrylate group, an epoxy group and an oxetane group, as shown below. Although not shown below, an alkyl group may be selected as the functional groups X or Y.

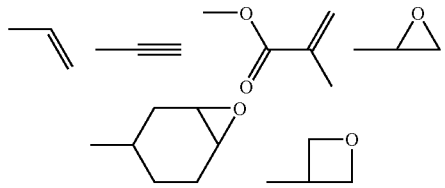

Specifically, Si alkoxide reacts with Me alkoxide of a sol type to form a sol-gel composite material. This composite material is an organic/inorganic hybrid type material, and its dielectric ratio and transmittance depend on a content ratio of Si alkoxide and Me alkoxide. A mixture ratio of 1:1 between Si alkoxide and Me alkoxide is beneficial for the gate insulating layer to have a dielectric ratio and transmittance.

In order for the gate insulating layer to have a high dielectric constant of 7 or greater, at least one of Ti, Zr, Y, Al, Hf, Ca and Mg is selected as a metal particle of the Me alkoxide.

The sol-gel compound of the Si alkoxide and the Me alkoxide is fabricated by a hydrolysis and condensation reaction. At this time, water or alcohol may be used as a catalyst for accelerating the reaction.

The sol-gel compound has a chemical network structure illustrated in FIG. 3. The sol-gel compound includes the functional groups X and Y, and its end or side chain is bonded to an alkyl group ($CHC_3-$, $C_2H_5-$, $C_3H_7-$, ..., $C_nH_{2n+1}-$) or phenyl group.

The sol-gel compound of the present invention has a high free molecular volume due to the functional groups X and Y. After the sol-gel composite material is mixed with a solvent and then uniformly coated on the substrate, it is soft-baked at a temperature of 70° C. and hard-baked at a temperature of 300° C. The composite material is less contracted during the baking processes because of the free volume obtained by the functional groups X and Y, thereby minimizing cracks on the surface of the gate insulating layer.

Furthermore, the functional groups X and Y induce a cross-linking in the molecules so that the heat-resistance of the composite material is improved.

The organic and inorganic composite material has excellent characteristics in the areas of insulation, coating, heat-resistance, hardness and transmittance, and its dielectric constant can easily be controlled. As a result, it is suitable for the gate insulating layer of TFTs.

The organic and inorganic composite material of the present invention can be formed by any one of printing, coating and deposition methods, and it also has an excellent planarization characteristic. Thus, the fabrication process of TFTs can be simplified.

After forming the gate insulating layer of the organic and inorganic composite material, an organic semiconductor layer 114 is formed of either a low polymer material such as a pentacene inducer or thiophene inducer, or a high polymer material such as polythiophene on the gate insulating layer 113.

A metal such as Au, Al, Ni, or the like is deposited on an entire surface including the organic semiconductor layer 114 by a sputtering process. The metal is then patterned by a photolithography process to form source and drain electrodes 115a and 115b at both sides of the semiconductor layer.

Thus, the organic TFT that includes the gate electrode 112a, the gate insulating layer 113, the organic semiconductor layer 114, and the source and drain electrodes 115a and 115b is completed.

The organic thin film transistor described above is a bottom-gate type thin film transistor wherein the gate electrode is positioned under the source and drain electrodes. However, it should be understood that the principles of the present invention is applicable to other types of thin film transistors including a top-gate type thin film transistor.

Also, it is possible to fabricate the above organic thin film transistor with a low-temperature process. Thus, a flexible plastic substrate or film may be used for the substrate 111. And, the interface property between the organic semiconductor layer and the gate insulating layer is improved so that a mobility of the thin film transistor may be increased.

Method for Fabricating TFT Array Substrate

A method for fabricating a TFT array substrate is the same as or similar to the aforementioned method for fabricating a TFT. Accordingly, the same reference numerals will be used to refer to the same or similar patterns.

Referring to FIG. 8, a metal having a low resistance, such as Cu, Al, AlNd, Mo, Cr, Ti, Ta, MoW, or the like is deposited on a substrate by a sputtering process. The metal is then patterned by a photolithography process to form a gate line 112 and a gate electrode 112a.

A gate insulating layer 113 is then formed on an entire surface including the gate electrode 112a using a composite material (Si-sol/Me-sol) including a sol-gel compound of Me alkoxide having a functional group X and Si alkoxide having a functional group Y. Each of the functional groups X and Y is selected from at least one of groups consisting of a functional group having a double bond or triple bond, an acrylate group, and an epoxy group and an oxetane group, as shown below. Although not shown below, an alkyl group may be selected as the functional groups X or Y.

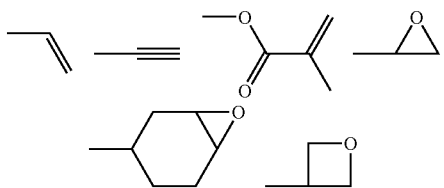

Specifically, Si alkoxide reacts with Me alkoxide of a sol type to form a sol-gel composite material. This composite material is an organic/inorganic hybrid type material, and its dielectric ratio and transmittance depend on a content ratio of Si alkoxide and Me alkoxide. A mixture ratio of 1:1 between Si alkoxide and Me alkoxide is beneficial for the gate insulating layer to have a high dielectric constant and transmittance.

In order for the gate insulating layer to have a high dielectric constant of 7 or greater, at least one of Ti, Zr, Y, Al, Hf, Ca and Mg is selected as a metal particle of the Me alkoxide.

The sol-gel compound of the Si alkoxide and the Me alkoxide is fabricated by a hydrolysis and condensation reaction. At this time, water or alcohol may be used as a catalyst for accelerating the reaction.

The sol-gel compound has a chemical network structure illustrated in FIG. 3. The sol-gel compound includes the functional groups X and Y, and its end or side chain is bonded to an alkyl group ($CHC_3-$, $C_2H_5-$, $C_3H_7-$, ..., $C_nH_{2n+1}-$) or phenyl group.

The sol-gel compound of the present invention has a high free molecular volume due to the functional groups X and Y. After the sol-gel composite material is mixed with a solvent and then uniformly coated on the substrate, it is soft-baked at a temperature of 70° C. and hard-baked at a temperature of 300° C. The composite material is less contracted during the baking processes because of the free volume obtained by the functional groups X and Y, thereby minimizing cracks on the surface of the gate insulating layer.

Furthermore, the functional groups X and Y induce a crosslinking in the molecules so that the heat-resistance of the composite material is improved.

The organic and inorganic composite material has excellent characteristics in the areas of insulation, coating, heat-resistance, hardness and transmittance, and its dielectric constant can easily be controlled. As a result, it is suitable for the gate insulating layer of TFT-LCDs.

The organic and inorganic composite material of the present invention can be formed by any one of printing, coating and deposition methods, and it also has an excellent planarization characteristic. Thus, the fabrication process of TFT-LCDs can be simplified.

After forming the gate insulating layer of the organic and inorganic composite material, a-Si is deposited on an entire surface of the substrate and then patterned to form a semiconductor layer 114. Then, a-Si doped with n-type impurity ions is deposited and patterned to form an ohmic contact layer 114a (n+a-Si).

A metal having a low resistance, such as Cu, Al, AlNd, Mo, Cr, Ti, Ta, MoW, or the like is then deposited on an entire surface including the ohmic contact layer 114a by a sputtering process. The metal layer is then patterned by a photolithography process to form source and drain electrodes 115a and 115b at both sides of the semiconductor layer 114 and to form a data line 115 connected with the source electrode 115a.

The gate and data lines cross each other to define a unit pixel, and the TFT including the gate electrode 112a, the gate insulating layer 113, the semiconductor layer 114, the ohmic contact layer 114a and the source and drain electrodes 115a and 115b is arranged adjacent to a crossing point between the gate and data lines. The TFT may be a top-gate type TFT or an organic TFT.

A passivation layer 116 is then formed on an entire surface including the TFT. the passivation layer 116 may be formed by coating an organic material such as BCB (Benzocyclobutene) or acrylic-based material, or by depositing an inorganic material such as SiNx or SiOx.

The passivation layer 116 is then selectively removed to partially expose the drain electrode 115b, thereby forming a contact hole. A transparent conductive material such as ITO or indium zinc oxide (IZO) is deposited on an entire surface of the passivation layer 116 including the contact hole and then patterned to form a pixel electrode 117 that is electrically in contact with the drain electrode 115b through the contact hole.

Although not shown, the aforementioned TFT array substrate is bonded to another substrate, with a liquid crystal layer therebetween. The opposing substrate includes a black matrix layer preventing light leakage, a color filter layer provided with R, G and B color resists in due order, an overcoat layer formed on the color filter layer to protect the color filter layer and planarize a surface of the color filter layer, and a common electrode formed on the overcoat layer to form an electric field along with the pixel electrode 117 of the TFT array substrate.

As described above, the method for fabricating the TFT array substrate according to the present invention has the following advantages.

First, the sol-gel compound of the present invention has a high free molecular volume due to the functional groups X and Y. As a result, the composite material is less contracted during the baking processes, thereby minimizing cracks on the surface of the gate insulating layer.

Second, the functional groups X and Y of the sol-gel compound induce a cross-linking in the molecules so that the heat-resistance of the gate insulating layer is improved.

Third, because various characteristics of the organic and inorganic composite material such as insulation, coating, heat-resistance, hardness and transmittance can easily be controlled according to the content ratio of Si alkoxide and Me alkoxide, it is suitable for the gate insulating layer of TFTs or TFT-LCDs.

Finally, because the organic and inorganic composite material of the present invention can be formed by various methods including printing, coating and deposition methods, the fabrication process of TFTs or TFT-LCDs is simplified and an excellent planarization characteristic is obtained.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a thin film transistor (TFT) on a substrate, comprising:
    forming a gate electrode;
    forming a semiconductor layer insulated from the gate electrode and partially overlapped with the gate electrode;
    forming a gate insulating layer between the gate electrode and the semiconductor layer; and
    forming source and drain electrodes at both sides of the semiconductor layer,
    wherein the gate insulating layer includes a sol-gel compound including metal alkoxide and silicon alkoxide.

2. The method as claimed in claim 1,
    wherein metal alkoxide has a functional group X,
    wherein silicon alkoxide has a functional group Y, and
    wherein each of the functional groups X and Y is selected from at least one of groups consisting of a functional group having a double bond or triple bond, an acrylate group, an epoxy group, an oxetane group and an alkyl group.

3. The method as claimed in claim 2, wherein the sol-gel compound is cross linked by the functional groups X and Y.

4. The method as claimed in claim 1, wherein the metal alkoxide includes at least one of Ti, Zr, Y, Al, Hf, Ca and Mg.

5. The method as claimed in claim 1, wherein the sol-gel compound is additionally provided with a catalyst of water or alcohol.

6. The method as claimed in claim 1, wherein the gate insulating layer is formed by at least one of printing, coating and deposition methods.

7. The method as claimed in claim 6, wherein forming the gate insulating layer further includes a hardening process.

8. The method as claimed in claim 1,
    wherein the gate electrode is formed on the substrate,
    wherein the gate insulating layer is formed on an entire surface of the substrate including the gate electrode,
    wherein the semiconductor layer is formed on the gate insulating layer to partially overlap with the gate electrode, and
    wherein the source and drain electrodes are formed at both sides of the semiconductor layer.

9. The method as claimed in claim 1,
    wherein the source and drain electrodes are formed on the substrate,
    wherein the semiconductor layer is formed between the source and drain electrodes to overlap the source and drain electrodes,
    wherein the gate insulating layer is formed on the semiconductor layer,
    wherein the gate electrode is formed on the gate insulating layer to partially overlap with the semiconductor layer.

* * * * *